United States Patent
Shibata

(10) Patent No.: US 8,896,475 B2
(45) Date of Patent: Nov. 25, 2014

(54) CONTINUOUS-TIME OVERSAMPLING PIPELINE ANALOG-TO-DIGITAL CONVERTER

(71) Applicant: Hajime Shibata, Toronto (CA)

(72) Inventor: Hajime Shibata, Toronto (CA)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/869,454

(22) Filed: Apr. 24, 2013

(65) Prior Publication Data

US 2014/0266821 A1   Sep. 18, 2014

Related U.S. Application Data

(60) Provisional application No. 61/791,011, filed on Mar. 15, 2013.

(51) Int. Cl.
*H03M 1/38* (2006.01)
*H03M 1/00* (2006.01)

(52) U.S. Cl.
CPC .................................. *H03M 1/001* (2013.01)
USPC ............................................ 341/161; 341/155

(58) Field of Classification Search
USPC .................... 341/155, 120, 118, 161, 144
See application file for complete search history.

(56) References Cited

U.S. PATENT DOCUMENTS

| | | | |
|---|---|---|---|
| 5,861,828 A * | 1/1999 | Opris | 341/120 |
| 6,222,477 B1 | 4/2001 | Irie et al. | |
| 6,489,913 B1 | 12/2002 | Hansen et al. | |
| 7,280,064 B2 * | 10/2007 | Lin | 341/155 |
| 7,443,332 B2 * | 10/2008 | Knudsen | 341/161 |
| 8,102,206 B2 | 1/2012 | Shibata | |
| 8,284,085 B2 * | 10/2012 | Haroun et al. | 341/143 |
| 8,570,200 B2 * | 10/2013 | Ashburn et al. | 341/143 |

OTHER PUBLICATIONS

W. Kester, Data Conversion Handbook 3rd edition, Chapter 3, Section 3.2, Analog Devices, Inc. ISBN-10: 0750678410 2004.
W. Kester, "Oversampling interpolating DACs", MT-017, tutorial documents, Analog Devices, Inc. available at http://www.analog.com/static/imported-files/tutorials/MT-017.pdf, 2009.
B. Y. Kamath, R. G. Meyer, and P. R. Gray, "Relationship between frequency response and settling time of operational amplifiers", IEEE Journal of Solid-State Circuits, vol. SC-9, No. 6, Dec. 1974.
D. Gubbins, B. Lee, P. Hanumolu, and U. Moon, "A continuous-time input pipeline ADC," Custom Integrated Circuit Conference, Sep. 2008.
D. Gubbins, S. Kwon, B. Lee, P. Hanumolu, and U. Moon, "A continuous-time input pipeline ADC with inherent anti-alias filter," Custom Integrated Circuit Conference, Sep. 2009.
D. Gubbins, B. Lee, P. Hanumolu, and U. Moon, "Continuous-time input pipeline ADCs," IEEE Journal of Solid-State Circuits, vol. 45, No. 8, Aug. 2010.
H. Shibata, "Delta-Sigma ADC architecture exploration," Toronto Design Center Tech Talk, Jan. 17, 2013.

\* cited by examiner

*Primary Examiner* — Brian Young
(74) *Attorney, Agent, or Firm* — Kenyon & Kenyon, LLP

(57) ABSTRACT

A converter may include multiple converter stages connected in series. Each converter stage may receive a clock signal and an analog input signal, and may generate an analog output signal and a digital output signal. Each converter stages may include an encoder generating the digital output signal, a decoder generating a reconstructed signal, a delaying converter generating a delayed signal, and an amplifier generating a residue signal, wherein the delayed signal may be a continuous current signal.

27 Claims, 8 Drawing Sheets

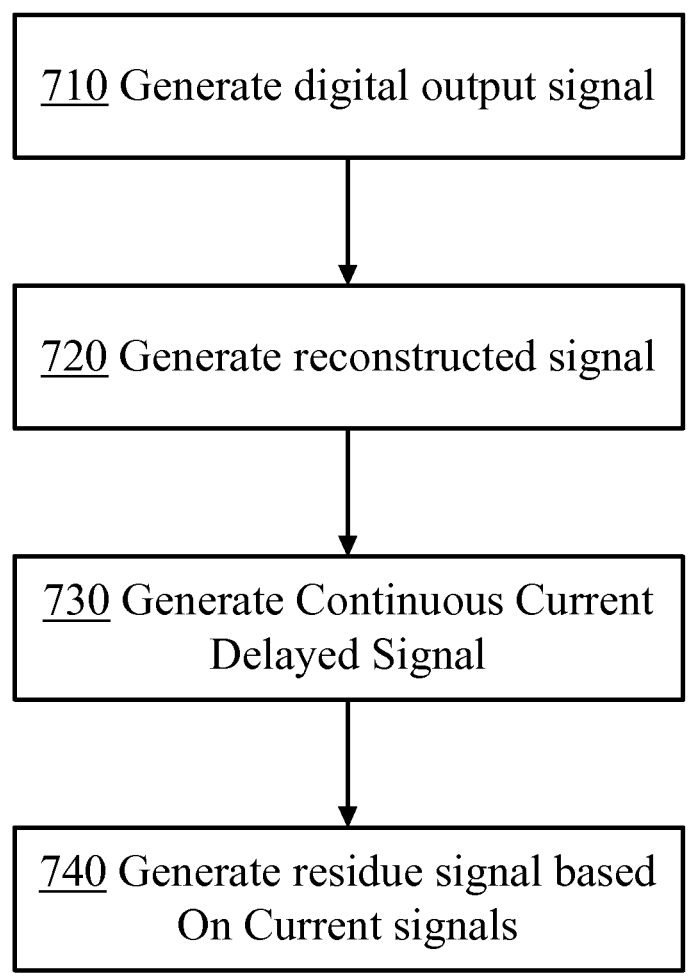

CONTINUOUS-TIME OVERSAMPLING PIPELINE ANALOG-TO-DIGITAL CONVERTER

CROSS REFERENCE

This application claims priority to U.S. Provisional Application Ser. No. 61/791,011, filed on Mar. 15, 2013, the entire content of which is hereby incorporated by reference in this application.

BACKGROUND

Analog-to-digital converters (ADC) have a variety of uses in applications relating to signal processing in various fields, for example, in processing relating to image, video, audio, data storage and retrieval.

A typical ADC may have a pipeline structure with multiple sample-and-hold or track-and-hold (T/H) circuits in multiple stages, which enables the ADC to process signals in discrete-time through the stages. As bandwidth requirement of the ADC increases to include higher frequencies in newer applications, the sampling rate of the ADC is also increased. Consequently, the high speed at which the T/H circuits need to settle may limit the conversion speed of the ADC. Additionally, the multiple T/H circuits and their clock drivers may take up valuable circuitry space and increase power consumption.

Thus, there is a need for improved ADC's that reduces T/H circuits by performing signal processing in continuous-time forms to decrease cost and power requirements while improving performance.

BRIEF DESCRIPTION OF THE DRAWINGS

FIG. 7 illustrates a method according to an embodiment of the present disclosure.

DETAILED DESCRIPTION

According to an exemplary embodiment of the present invention, a converter may include multiple converter stages connected in series. Each converter stage may receive a clock signal and an analog input signal, and may generate an analog output signal and a digital output signal. Each converter stages may include an encoder generating the digital output signal, a decoder generating a reconstructed signal, a delaying converter generating a delayed signal, and an amplifier generating a residue signal, wherein the delayed signal may be a continuous current signal.

A converter according to the present invention may include a pipeline structured ADC, where each converter stage may generate coarse granularity digital signals based on the analog input signal. Each converter stage also may generate for the next converter stage in the pipeline, a residue signal which is in the continuous-time signal form instead of discrete-time form. Thus, the converter may be an improved ADC design with lower power and better wideband performance.

Figure 1:
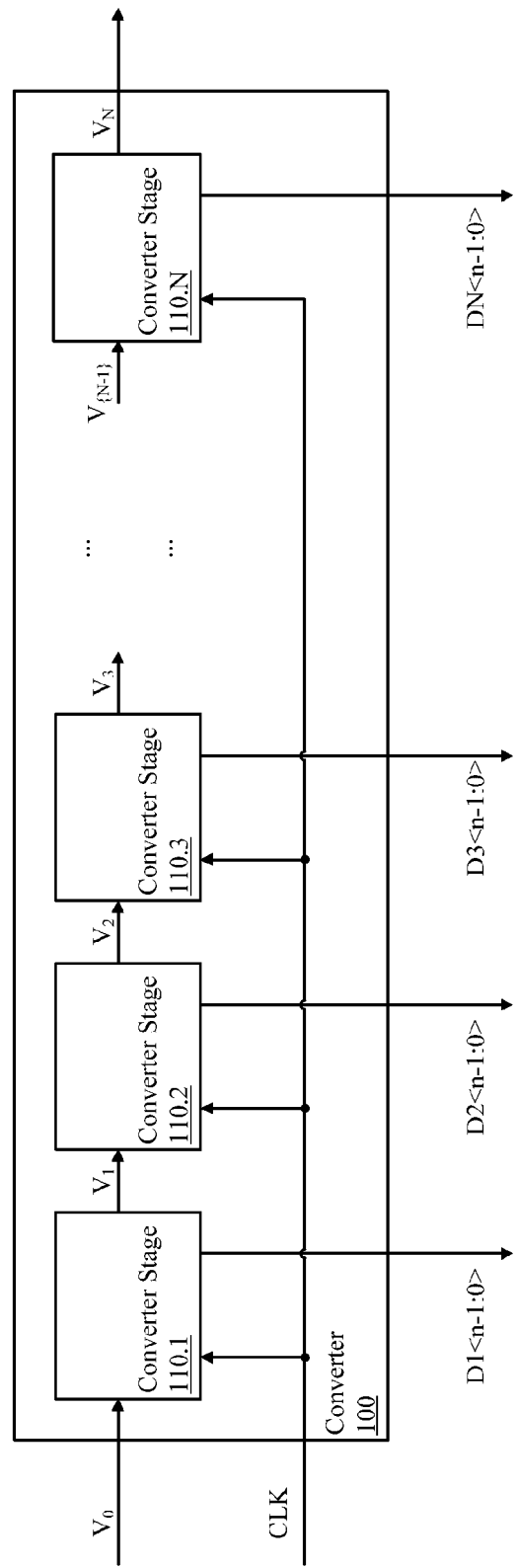
FIG. 1 illustrates a simplified block diagram of a converter according to an embodiment of the present disclosure.

FIG. 1 illustrates a simplified block diagram of a converter 100 according to an embodiment of the present disclosure.

According to an embodiment, the converter 100 may include a plurality of converter stages 110.1-110.N, connected in series, in pipeline, or in cascade configuration.

Each converter stage 110.1-110.N may receive a clock signal CLK and a respective analog input voltage signal $V_0$ to $V_{\{N-1\}}$, and may generate a respective analog voltage output signal $V_1$ to $V_N$ and a respective digital output signal D1<n−1:0> to DN<n−1:0>, where n may represent the bit resolution of each converter stage. While it is illustrated in FIG. 1 that all converter stages have the same n number of bits for digital resolution, the converter stages need not have the same number of bits for digital resolution. Additionally, more than three converter stages may be implemented in a converter.

In other words, all converter stages may receive the same clock signals, but the converter stages may be connected in series or in a cascade configuration via their respective analog input signals and analog output signals. Each converter stage may generate respective digital output signals, which may be combined to form an overall digital output for the converter 100.

The overall output signal may be reconstructed based on all of the digital output signals from all the converter stages in the converter, and may represented as:

$$V_{IN}(s)=D_1(s)+H^{-1}(s)D_2(s)+H^{-2}(s)D_3(s)+H^{-3}(s)D_4(s)+H^{-4}(s)D_5(s)+$$

where $D_X(s)$ is the digital output signals coded at converter stage x in frequency domain multiplied by one-clock digital-to-analog converter (DAC) waveform (sin c waveform, where sin c(t)=sin e(t)/t) in the frequency domain and H(s) is the combined transfer function of the delay-converter and the amplifier, if every converter stage is identical. If the converter stage transfer functions are different, the equation may need to be modified accordingly.

The converter 100 may be a continuous-time pipeline ADC capable of wide-bandwidth operation, with a bandwidth of approximate 500 MHz-to-1 GHz with 10 GHz clock frequency, for example for a converter manufactured on a 28 nm CMOS manufacturing process.

Figure 2:
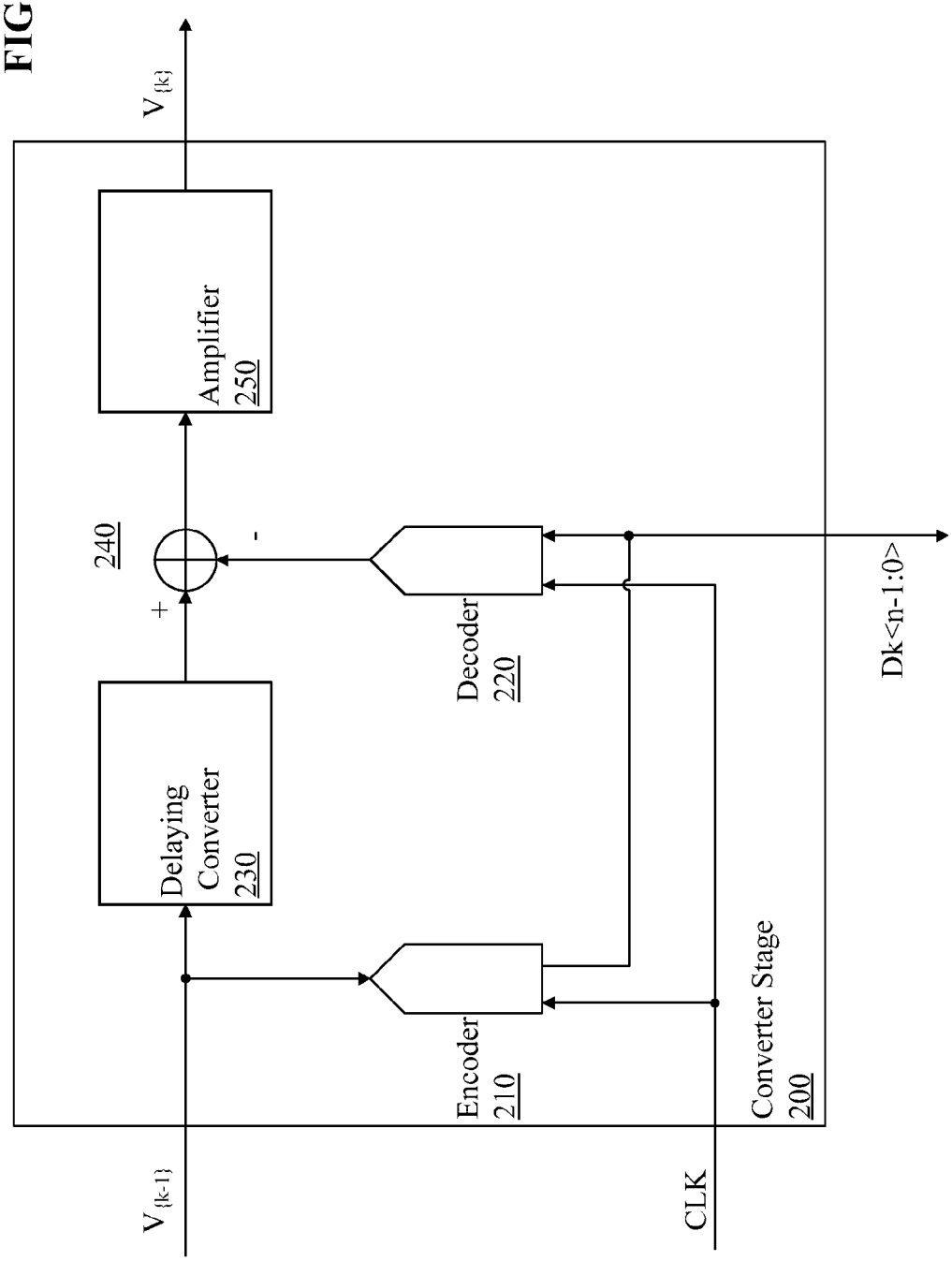
FIG. 2 illustrates a simplified block diagram of a converter stage according to an embodiment of the present disclosure.

FIG. 2 illustrates a simplified block diagram of a converter stage 200 according to an embodiment of the present disclosure.

According to an embodiment, a converter stage 200 may include an encoder 210 generating the digital output signal, a decoder 220 generating a reconstructed signal, a delaying converter 230 generating a delayed signal, and an amplifier 250 generating a residue signal, wherein the delayed signal may be a continuous current signal.

The analog input signal $V_{\{k-1\}}$ for stage k converter stage may be received by the encoder 210, which generates, using the clock signal, a digital output signal Dk<n−1:0>. The encoder 210 may include sets of comparators comparing the analog input signal $V_{\{k-1\}}$ to multiple predetermined voltage levels to obtain n bits for digital output signal Dk<n−1:0>.

The decoder 220 may receive the digital output signal Dk<n−1:0> from the encoder 210 in the same converter stage 200. The decoder 220 may generate a reconstructed signal, based on the digital output signal Dk<n−1:0> and the clock signal CLK. The decoder 220 may generate the reconstructed signal as a current signal. Optionally, the decoder 220 may include an output filter (not shown) to filter the reconstructed signal to reduce some of its high frequency noise, caused by frequency mirroring during analog-to-digital conversion. The output filter in the decoder 220 may be a low-pass filter or a band-pass filter.

The delaying converter 230 may receive the analog input signal $V_{\{k-1\}}$ and may generate a delayed signal, which may be a continuous current signal. The delaying converter 230 may delay the delayed signal from the analog input signal by a predetermined period of time based on a period of the clock signal. The delay may be need to be matched to the delays in the encoder 210 and the decoder 220, to minimize the residue signal amplitude propagated to the subsequent stages. The delaying converter 230 may delay the delayed signal from the analog input signal $V_{\{k-1\}}$ by 1.5 times of a period of the clock signal, because it may take generally 1 clock period for the encoder 220 and the decoder 230 to reconstruct the original analog input signal $V_{\{k-1\}}$, and it may take approximately 0.5 clock period for zero-order hold response of the decoder 230. The delaying converter 230 may include a voltage-to-current converter that generates, based on voltage of the analog input signal $V_{\{k-1\}}$, the continuous current signal.

The amplifier 250 may generate, based on a difference of currents of the respective delayed signal and the respective reconstructed signal, a residue signal $V_{\{k\}}$ as an analog output signal. The amplifier 250 may amplify the respective residue signal, to provide a gain of signal for the next converter stage in the cascade. The amplifier 250 may include a lossy integrator.

Optionally, the converter stage 200 may include a subtractor 240 that subtracts the reconstructed signal from the delayed signal.

In a last converter stage in a converter, only the encoder 210 may be needed, as the other components are not needed in the last converter stage, because the last converter stage does not need to generate a residue signal.

The low-frequency voltage gain $H_{LF}$ of the converter stage 200 may be needed to recover the voltage swing reduced by the subtraction of the signals that generates the residue signal in the converter stage 200. The gain $H_{LF}$ may recover the stage output voltage amplitude to approximately the same level as the stage input signal. In general, the gain $H_{LF}$ may be designed to be between $2^{n-1}$ and $2^n$ where n is the bit resolution of the encoder 210. This is because in a single converter stage, the encoder 210 may quantize the analog input signal at $2^n$ voltage levels, and the analog reconstructed signal may have $2^n$ signal levels. Thus, the difference between the analog input signal and the reconstructed signal, when converted into the voltage form of the residue signal, should be no more than $\frac{1}{2}^n$ of the range of the signal levels of the converter stage. To allow the residue signal to be sensed with similar signal levels in the next converter stage, the residue signal may be amplified by $2^{n-1}$ to $2^n$ times. This may result in the residue signal being amplified to have a voltage swing range that is similar to the analog input signal. Amplifying residue signal may allow the next converter stage to quantize the residue signal at similar voltage ranges, and thus reduce susceptibility of the converter to noise. The gain of the converter stage 200 may be preset by design, or may be tuned or programmed in operation. The converter stage 200 may output a gain value signal (not shown), to enable the reconstruction of the overall signal during digital-to-analog conversion. The low-frequency gain $H_{LF}$ of the converter stage 200 may be set to a value based on the bit resolution of the converter stage 200. Since the residue voltage level is recovered by the amplifier 250, the structure of the converter stages may be identical (or impedance-scaled) in a cascade configuration. A maximum residue output voltage amplitude may be within 1.5 times of the maximum input voltage amplitude of the pipeline stage when the ADC system is operating according to the present invention.

Figure 3:
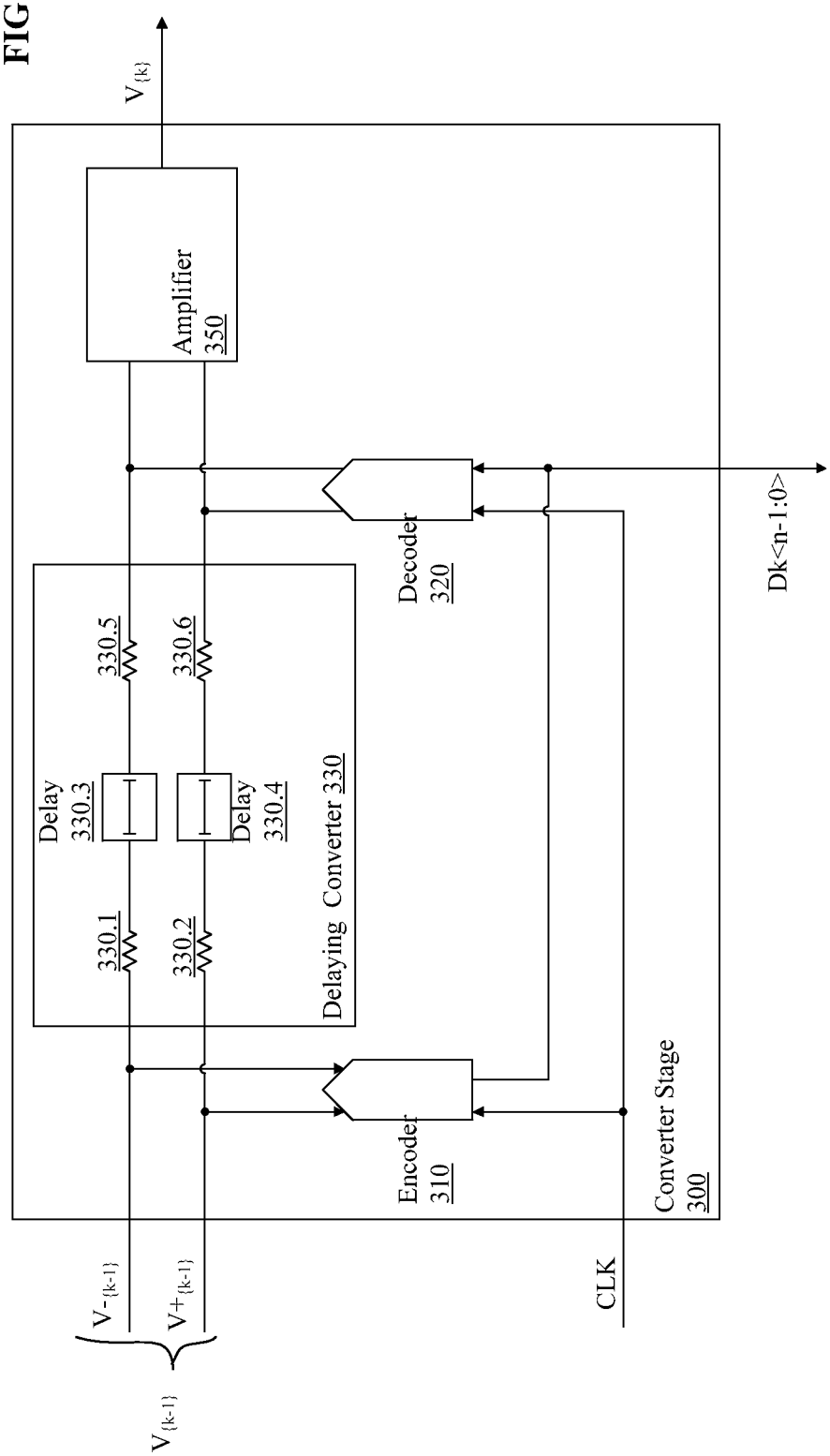
FIG. 3 illustrates a simplified block diagram of a converter stage according to features of the present disclosure.

FIG. 3 illustrates a simplified block diagram of a converter stage 300 according to features of the present disclosure.

According to an embodiment, a converter stage 300 may include an encoder 310 generating the digital output signal, a decoder 320 generating a reconstructed signal, a delaying converter 330 generating a delayed signal, and an amplifier 350 generating a residue signal, wherein the delayed signal may be a continuous current signal.

FIG. 3 is similar to FIG. 2, and FIG. 3 illustrates the delaying converter 330 in greater detail.

The delaying converter 330 may receive two signals $V-_{\{k-1\}}$ and $V+_{\{k-1\}}$, which may be the positive and negative differential signals that are included in signal $V_{\{k-1\}}$. The delaying converter 330 receive each of the signals $V-_{\{k-1\}}$ and $V+_{\{k-1\}}$ in each of two branches. The first branch may include resistor 330.1, delay 330.3, and resistor 330.5 connected in series. The second branch may include resistor 330.2, delay 330.4, and resistor 330.6 connected in series. Resistor 330.1, delay 330.3, and resistor 330.5 may need to be impedance matched, to avoid signal reflection or degradation. The resistor 330.1 and 330.2 may be adjusted or may be omitted if the signal source connected to the ADC input or the first pipeline stage has non-zero output impedance. Similarly, resistor 330.2, delay 330.4, and resistor 330.6 may need to be impedance matched. Additionally, the first branch and the second branch may need to be impedance matched. The delays 330.3 and 330.4 may be continuous-time delay blocks, such as transmission line delay blocks, cascaded LC lattice filters, active-RC delay filters, or RC, LC, LCR filters, and may be implemented on integrated chip (IC).

In this configuration, the delaying converter 330, if properly tuned and matched, may have superior performance in most frequency ranges. However, providing delays 330.3 and 330.4 may require specially manufactured device structures that take up significant circuitry space. Thus, the cost of this configuration may be too high for most applications.

Figure 4:
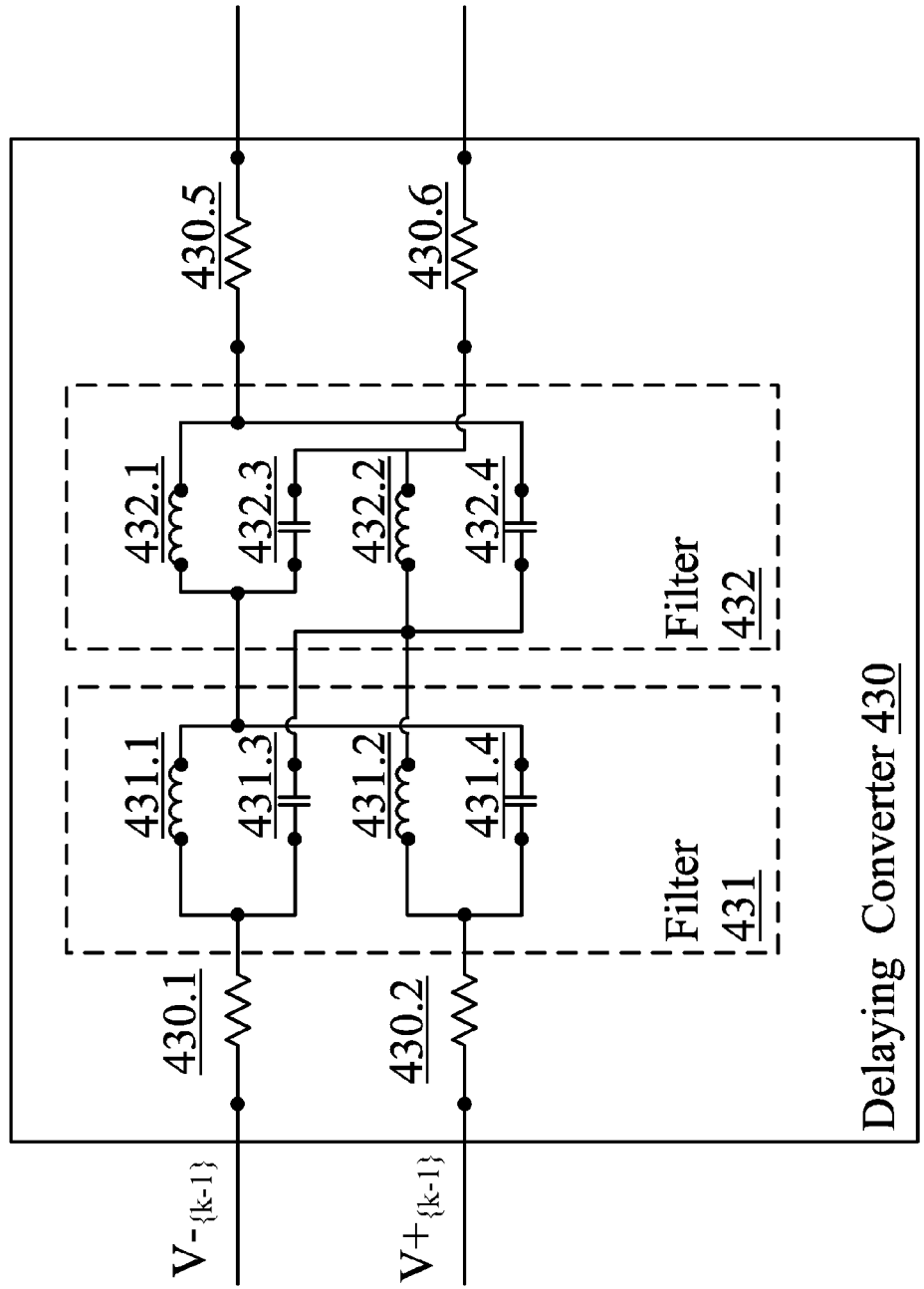
FIG. 4 illustrates a simplified block diagram of a delaying converter according to an embodiment of the present disclosure.

FIG. 4 illustrates a simplified block diagram of a delaying converter 430 according to an embodiment of the present disclosure.

Delaying converter 430 illustrates an alternative design, where instead of the delays 330.3 and 330.4, multiple serially connected filters 431 and 432 are used as delays. The delaying converter 430 may include resistors 430.1, 430.2, 430.5, and 430.6 as impedance matched resistors, and filters 431 and 432 connected in cascade. The filters 431 and 432 may be identical to each other, and more than one stages of filters may be used. Additional stages of filters in this configuration may provide better phase matching performance.

Filter 431 may include inductors 431.1 and 431.2 and capacitors 431.3 and 431.4. Filter 432 may include inductors 432.1 and 432.2 and capacitors 432.3 and 432.4. Each inductor may be connected in series with the next component in the same branch of the delaying converter 430. Each capacitor may be connected in series with the next component in the other branch, thus forming criss-crossing configurations. Filters 431 and 432 may be also known as lattice LC filters.

Delaying converter 430 in this configuration may provide superior performance in the low frequency range (for example, less than 1 GigaHz), but may not be as ideal as the delaying converter 330 in FIG. 3. However, delaying converter 430 requires significantly less circuitry space, as all the components can be easily manufactured and miniaturized.

Figure 5:
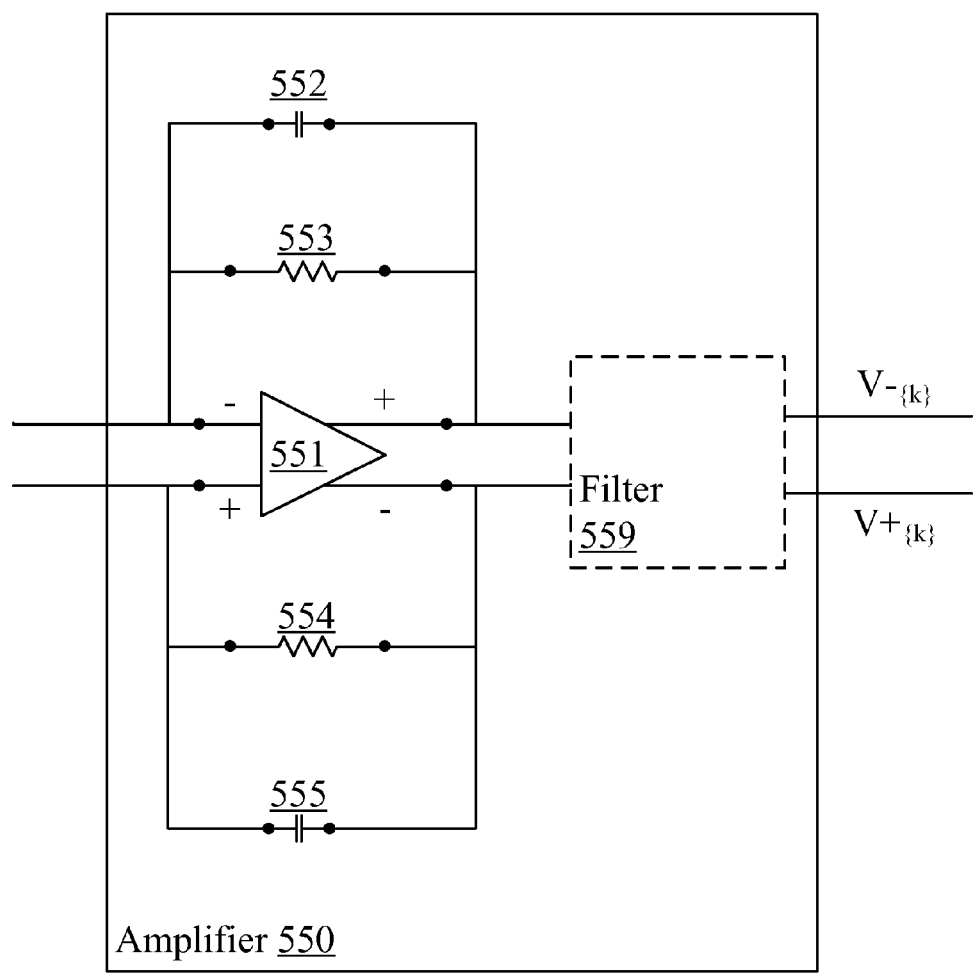
FIG. 5 illustrates a simplified block diagram of an amplifier of a converter stage according to an embodiment of the present disclosure.

FIG. 5 illustrates a simplified block diagram of an amplifier 550 of a converter stage according to an embodiment of the present disclosure.

Amplifier 550 may include an op-amp 551, capacitors 552 and 555, and resistors 553 and 554. Amplifier 550 may receive current signals in a converter stage, and convert the current signal into a residue signal as a continuous-time voltage signal, (illustrated in FIG. 5 as differential voltage signals, $V-_{\{k\}}$ and $V+_{\{k\}}$).

Optionally, amplifier 550 may include an output filter 559, which may be a low-pass or band-pass filter. The output filter 559 may help reduce some of the high frequency noise in the output voltage signal, caused by frequency mirroring during analog-to-digital conversion.

In the configuration illustrated in FIG. 5, the amplifier 550 may have a negative and a positive signal path. The negative signal path may have capacitor 552 and resistor 553 parallel to each other and included in a feed-forward path. Similarly, the positive path may have capacitor 555 and resistor 554 parallel to each other and included in a feed-forward path. This configuration may form a lossy integrator in the amplifier 550.

In operation, if the amplifier 550 is implemented in the same converter stage as the delaying converter 330, then the converter stage may have a gain HLF represented as:

$$H_{LF}=H(0)=R_F/(2R_Z),$$

where $R_F$ is the resistance value of resistors 553 and 554 in amplifier 550, and $R_Z$ is the resistance value of resistors 330.1, 330.2, 330.5, and 330.6 in delaying converter 330.

Figure 6:
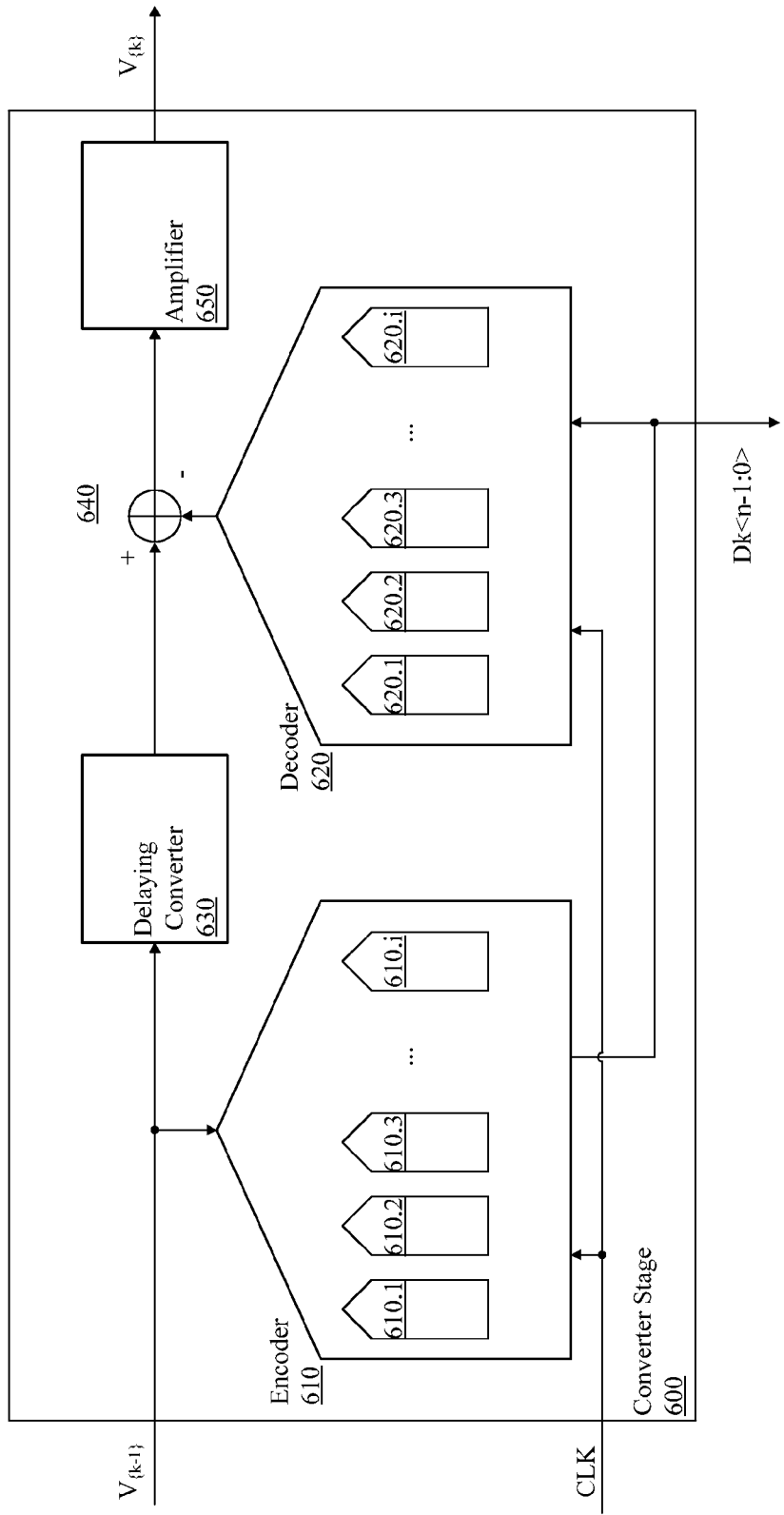
FIG. 6 illustrates a simplified block diagram of a converter stage according to an embodiment of the present disclosure.

FIG. 6 illustrates a simplified block diagram of a converter stage 600 according to an embodiment of the present disclosure.

According to an embodiment, a converter stage 600 may include an encoder 610 generating the digital output signal, a decoder 620 generating a reconstructed signal, a delaying converter 630 generating a delayed signal, and an amplifier 650 generating a residue signal, wherein the delayed signal may be a continuous current signal.

Optionally, the converter stage 600 may include a subtractor 640.

The converter stage 600 is similar to the converter stage 200 in FIG. 2, and the converter stage 600 illustrates additional details.

In the converter stage 600, encoder 610 may include multiple encoders 610.1 to 610.i. The multiple encoders 610.1 to 610.i may be connected in parallel, with each receiving the same analog input signal $V_{\{k-1\}}$, but may receive different clock signals from a clock bus CLK, where the different clock signals are staggered or interleaved, such that the multiple encoders 610.1 to 610.i may be triggered by the staggered clock signals to perform their own analog-to-digital conversions at different times. Preferably, the staggering or interleaving spread out the analog-to-digital conversions fairly evenly over time.

Correspondingly, decoder 620 may include multiple decoders 620.1 to 620.i. The multiple decoders 620.1 to 620.i may receive the digital signals from a corresponding encoder 610.1 to 610.i to convert to reconstructed signals, which may be analog current signals. The multiple decoders 620.1 to 620.i may be connected in parallel, with each receiving different clock signals from a clock bus CLK, where the different clock signals are staggered or interleaved, such that the multiple decoders 620.1 to 620.i may be triggered by the staggered clock signals to perform their own digital-to-analog conversions at different times. Preferably, the staggering or interleaving spread out the digital-to-analog conversions fairly evenly over time.

Interleaved output signals may overlapped each other in time period. The interleaving or staggering order of the multiple encoders 610.1 to 610.i and the multiple decoders 620.1 to 620.i may be reordered or shuffled over time to minimize the interleaving or encoder to decoder mismatch.

The multiple staggered or interleaved analog-to-digital conversion may improve the overall accuracy and extend the effective bandwidth of the converter stage and the overall converter by increasing number of samples.

Alternatively, the different clock signals may be generated internally in the converter stage 600 based on a single input clock signal, by for example, splitting the single clock signal into multiple clocks signals, each adding a predetermined delay time.

The reconstructed signals from the multiple decoders 620.1 to 620.i may be subtracted from the delayed signal from the delaying converter 630. However, because there are multiple decoders 620.1 to 620.i, their respective reconstructed signals may conflict or interfere with each other.

If the multiple decoders 620.1 to 620.i are simultaneous driving reconstructed signals as current signals, then their signal magnitudes may need to be scaled down, for example by factor of i. Then the multiple decoders 620.1 to 620.i may drive reconstructed signals as current signals into the same node. The simultaneous and scaled down driving by the multiple decoders 620.1 to 620.i may produce a smoothing or filtering effect on the combined reconstructed signal, by effectively averaging every change in the reconstructed signal by i.

Alternatively, the multiple decoders 620.1 to 620.i may also be staggered or interleaved on their outputs by their respective staggered or interleaved clock signals, such that only one of the multiple decoders 620.1 to 620.i may drive a reconstructed signal at any given time. The staggered or interleaved output by the multiple decoders 620.1 to 620.i may tend to produce more high frequency noise, and may cost additional circuitry space.

FIG. 7 illustrates a method 700 according to an embodiment of the present disclosure.

The method 700 may include, at block 710, an encoder may generate, based on an analog input signal and a clock signal, a digital output signal. At block 720, a decoder may generate, based on the digital output signal and the clock signal, a reconstructed signal. At block 730, a delaying converter may generate, based on the analog input signal, a delayed signal, which may be a current signal. At block 740, an amplifier may generate, based on the delayed signal and the reconstructed signal, a residue signal.

FIGS. 8A-8D illustrate signal graphs according to embodiments of the present disclosure.

Figure 8A:
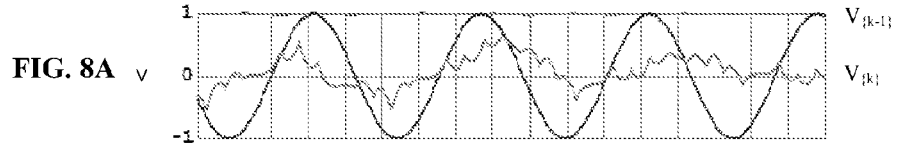
FIGS. 8A-8D illustrate signal graphs of a converter stage according to an embodiment of the present disclosure.

FIG. 8A illustrates voltage signal graphs of an analog input signal $V_{\{k-1\}}$ and an analog residue signal $V_{\{k\}}$ of an exemplary converter stage.

Figure 8B:

FIG. 8B illustrates current signal graphs of an analog input signal converted current signal $I_{\{k-1\}}$, the delayed current signal $I_{Delayed}$, and the reconstructed current signal $I_{Reconstructed}$ of an exemplary converter stage.

$I_{\{k-1\}}$ may be the current signal converted from the analog input signal $V_{\{k-1\}}$ without any delays. The delayed current signal $I_{Delayed}$ may be generated from the delaying converter and may be the delayed version of signal $I_{\{k-1\}}$. The reconstructed current signal $I_{Reconstructed}$ is generated by the decoder that generates the reconstructed current signal based on the digital output signal from the encoder. Note that the reconstructed current signal $I_{Reconstructed}$ has a delay from the original analog input signal, due to delays in the encoder and the decoder.

Figure 8C:
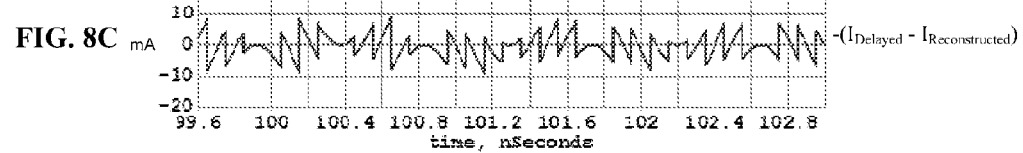

FIG. 8C illustrates current signal graphs of an difference signal $-(I_{Delayed}-I_{Reconstructed})$ of an exemplary converter stage.

The difference signal $-(I_{Delayed}-I_{Reconstructed})$ may also be a current signal, which represents the difference between the delayed original signal converted to current signal and a reconstructed current signal based on digital output of the converter stage. This difference signal may be received by the amplifier to generate the analog residue signal ($V_{\{k\}}$ in FIG. 8A) for output for the converter stage.

Figure 8D:
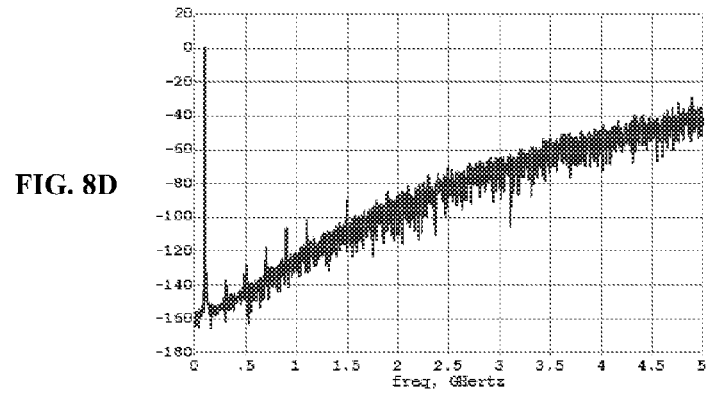

FIG. 8D illustrates a plot of signal strength over frequency for analog signal reconstructed from an overall combined digital output signal from an exemplary multi-stage converter. The plot of FIG. 8D shows that the analog signal reconstructed from an overall combined digital output signal has a maximum signal strength of 0 dB at a frequency of around 100 MHz (the frequency of the analog input signal $V_{\{k-1\}}$). While noise at higher frequencies increases as frequency increases, the noise level at the frequency range of interest near the low frequency range of 100 MHz is relatively low, and this may provide sufficient signal margin and thus indicate significant accuracy for the converter in the present invention.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

I claim:

1. A converter, comprising:
   a plurality of converter stages connected in series, each receiving a clock signal and a respective continuous-time analog input voltage, and generating a respective analog output signal and a respective digital output signal;
   wherein intermediate converter stages each comprise:
   an encoder generating, based on the respective continuous-time analog input voltage and the clock signal, the respective digital output signal;
   a decoder generating, based on the respective digital output signal and the clock signal, a respective reconstructed signal as a current signal;
   a delaying converter generating, based on the respective continuous-time analog input voltage, a respective delayed signal as a continuous-time current signal; and
   an amplifier generating, based on a comparison of the currents representing the respective delayed signal and the respective reconstructed signal, a respective residue signal.

2. The converter according to claim 1, wherein the respective digital output signals are combined to form a digital output of the converter.

3. The converter according to claim 1, wherein the respective delayed signal is delayed from the respective continuous-time analog input voltage by a predetermined period of time based on a period of the clock signal.

4. The converter according to claim 1, wherein the respective delayed signal is delayed from the respective continuous-time analog input voltage by 1.5 times of a period of the clock signal.

5. The converter according to claim 1, wherein the amplifier generates, based on a difference of currents of the respective delayed signal and the respective reconstructed signal, the respective residue signal.

6. The converter according to claim 1, wherein the amplifier amplifies the respective residue signal with a gain, which is set based on the bit resolution of the corresponding encoder.

7. The converter according to claim 1, wherein the amplifier filters the respective residue signal.

8. The converter according to claim 1, wherein the respective residue signal is a voltage signal.

9. The converter according to claim 1, wherein each of the converter stages outputs a gain signal.

10. A method, comprising:
    generating by an encoder, based on a continuous-time analog input voltage and a clock signal, a digital output signal;
    generating by a decoder, based on the digital output signal and the clock signal, a reconstructed signal as a current signal;
    generating by a delaying converter, based on the continuous-time analog input voltage, a delayed signal as a continuous-time current signal;
    generating by an amplifier, based on a comparison of the currents representing the delayed signal and the reconstructed signal, a residue signal.

11. The method according to claim 10, wherein the residue signal is further converted to digital signals.

12. The method according to claim 10, wherein the delayed signal is delayed from the continuous-time analog input voltage by a predetermined period of time based on a period of the clock signal.

13. The method according to claim 10, wherein the delayed signal is delayed from the continuous-time analog input voltage by 1.5 times of a period of the clock signal.

14. The method according to claim 10, wherein the amplifier generates, based on a difference of currents of the delayed signal and the reconstructed signal, the residue signal.

15. The method according to claim 10, wherein the amplifier amplifies the residue signal with a gain, which is set based on bit resolution of the encoder.

16. The method according to claim 10, wherein the amplifier filters the respective residue signal.

17. The method according to claim 10, wherein the respective residue signal is a voltage signal.

18. The method according to claim 10, wherein each of the converter stages outputs a gain signal.

19. A converter, comprising:
    a plurality of pipelined converter stages, each having an output for a digital signal, an input for an input voltage and an input for a clock signal, wherein:
    a first stage receives an input voltage signal to be converted and generates an residual voltage signal to a next converter stage,
    each intermediate converter stage receives the residual voltage signal from a respective preceding stage and outputs its residual voltage signal to a next converter stage,
    wherein the intermediate converter stages each comprise:
    a clocked encoder to generate the stage's respective digital output signal;
    a clocked decoder to generate from a current signal representing the stage's respective digital output signal;
    an unclocked delay unit to generate from, the stage's respective input voltage, a continuous-time current signal representing a delayed version of the stage's input voltage; and
    an amplifier to generate from a comparison of the currents from the decoder and the delay unit, the stage's residue signal.

20. The converter according to claim 19, wherein the respective digital output signals are combined to form a digital output of the converter.

21. The converter according to claim 19, wherein the continuous-time current signal is delayed from the respective input voltage by a predetermined period of time based on a period of the clock signal.

22. The converter according to claim 19, wherein the continuous-time current signal is delayed from the respective input voltage by 1.5 times of a period of the clock signal.

23. The converter according to claim 19, wherein the amplifier generates, based on a difference of currents of the continuous-time current signal representing the delayed version of the stage's input voltage and the current signal representing the stage's respective digital output signal, the respective residue signal.

24. The converter according to claim 19, wherein the amplifier amplifies the stage's residue signal with a gain, which is set based on the bit resolution of the corresponding encoder.

25. The converter according to claim 19, wherein the amplifier filters the stage's residue signal.

26. The converter according to claim 19, wherein the stage's residue signal is a voltage signal.

27. The converter according to claim 19, wherein each of the converter stages outputs a gain signal.

* * * * *